US007042791B2

(12) United States Patent
Park (10) Patent No.: US 7,042,791 B2
(45) Date of Patent: May 9, 2006

(54) MULTI-PORT MEMORY DEVICE WITH GLOBAL DATA BUS CONNECTION CIRCUIT

(75) Inventor: Byung-Il Park, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 176 days.

(21) Appl. No.: 10/876,403

(22) Filed: Jun. 25, 2004

(65) Prior Publication Data

US 2005/0249015 A1    Nov. 10, 2005

(30) Foreign Application Priority Data

May 6, 2004    (KR) .................... 10-2004-0031931

(51) Int. Cl.
   *G11C 8/00*    (2006.01)
(52) U.S. Cl. ............... 365/230.05; 365/63; 365/230.03
(58) Field of Classification Search ........... 365/230.05, 365/230.03, 63
   See application file for complete search history.

(56) References Cited

U.S. PATENT DOCUMENTS 5,586,299 A * 12/1996 Wakerly ..................... 711/149
6,868,030 B1 * 3/2005 Okuyama et al. ...... 365/230.03

* cited by examiner

*Primary Examiner*—Tuan T. Nguyen
*Assistant Examiner*—N Nguyen
(74) *Attorney, Agent, or Firm*—Blakely Sokoloff Taylor & Zafman (57) ABSTRACT

There is provided a multi-port memory device, which is capable of minimizing a layout area of a global data bus connection circuit while maintaining a line arrangement of global data buses. The multi-port memory device includes a plurality of unit global data bus connection circuits for selectively connecting first and second global data buses, each of which includes a plurality of lines. The plurality of unit global data bus connection circuits are arranged in M×N matrix (M and N are integers greater than or equal to two). The respective unit global data bus connection circuits are overlapped with line axis of the corresponding first and second global data buses and adjacent line axis. Loads to be driven by the control signal of the global data bus connection circuit can be reduced and skew of the pipe register control signal can be minimized.

6 Claims, 11 Drawing Sheets

MULTI-PORT MEMORY DEVICE WITH GLOBAL DATA BUS CONNECTION CIRCUIT

FIELD OF THE INVENTION

The present invention relates to a semiconductor memory design technology; and, more particularly, to an arrangement of a global data bus connection circuit for use in a multi-port memory device.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CPU, and so on. In order to implement such a multi-port memory device, any one of a plurality of ports must be able to provide an access to all memory cells.

For the purpose of the multi-port access, global data buses must be adjacent to all banks. In this case, a line length of the global data bus is increased, such that a loading of the global data bus is also increased. Also, the increased loading of the global data bus becomes more serious as the number of banks and the number of the lines of the global data buses are increased. Here, the number of lines of the global data buses has a close relation to a bandwidth.

Korean Patent Application NO. 2003-92375, filed by the same applicant on Dec. 17, 2003, discloses an architecture of a multi-port memory device, in which global data buses are divided according to areas and a global data bus connection circuit is applied thereto for connecting adjacent global data to each other.

Figure 1:
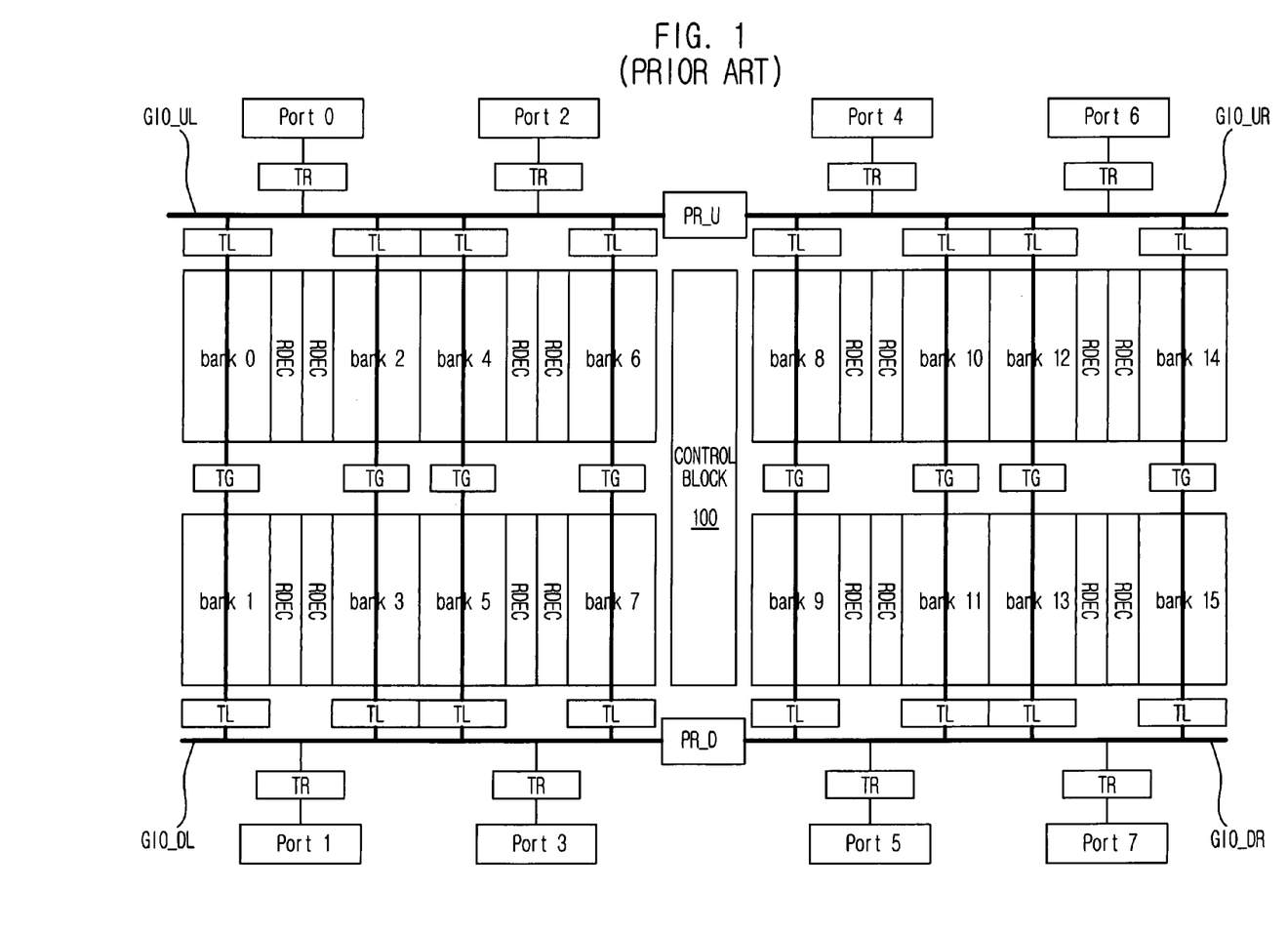
FIG. 1 illustrates an architecture of a 256M multi-port DRAM, which is disclosed in Korean Patent Application No. 2003-92375.

FIG. 1 is a block diagram illustrating an architecture of a 256M multi-port DRAM, which is disclosed in Korean Patent Application No. 2003-92375.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks TR.

The plurality of banks bank0 to bank15 are arranged in a row direction (a right and left direction in the drawing) as many as a predetermined number at four divided sections (quadrants) of a core area.

The control block 100 is arranged between the first/third quadrants and the second/fourth quadrants to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quadrants and perform an independent communication with different target devices.

The first to fourth global data buses GIO_UL, GIO_UR, GIO_DL and GIO_DR are arranged between each bank and each port corresponding to the respective quadrants in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks The plurality of transfer bus connection blocks TG arranged between two banks, which are adjacent to each other in a column direction, and selectively connect the two transfer buses TB.

The plurality of bus connection blocks TL are arranged between each bank and each global data bus of the quadrant in which each bank is contained, and perform a data exchange between the corresponding transfer bus TB and the corresponding global data bus.

The plurality of data transfer blocks TR are arranged between each port and each global data bus of the quadrant in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8k(row)×2k(column)) and the row decoder RDEC. Each bank includes a core circuit, such as a bit line sense amplifier and an equalizer, which is necessary in a typical DRAM core. The banks bank0 to bank15 are arranged at the four quadrants, each of which includes four banks in a row direction. In detail, the banks bank0, bank2, bank4 and bank6 are arranged at the first quadrant (a left and up section) of the core area, and the banks bank8, bank10, bank12 and bank14 are arranged at the second quadrant (a right and up section). Also, the banks bank1, bank3, bank5 and bank7 are arranged at the third-quadrant (a left and down-section), and the banks bank9, bank11, bank13 and bank15 are arranged at the fourth quadrant (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses, which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA, and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quadrants, each of which includes two ports. The die edge portion means a major axis portion shared by all banks of the corresponding quadrant. In detail, the ports port0 and port2 are arranged at the first quadrant, and the ports port4 and port6 are arranged at the second quadrant. The ports port1 and port3 are arranged at the third quadrant, and the ports prot5 and port7 are arranged at the fourth quadrant. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quadrant, and the second global data bus GIO_UR is arranged at the second quadrant. The third global data bus GIO_DL is arranged at the third quadrant, and the fourth global data bus GIO_DR is arranged at the fourth quadrant. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quadrants, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buses for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quadrant to which the corresponding bank belongs. The write bus connection circuit includes a write latch for sensing and latching a write data, which is applied on the global data bus, and a write driver for driving the write data to the transfer bus TB.

The data transfer block TR includes a transmitter (Tx) for transmitting a write data applied on a corresponding port to the global data bus, and a receiver (Rx) for receiving a read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quadrants and between the ports corresponding to the third and fourth quadrants. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quadrants. Transfer gate control lines (TGC<0:3>) extending from the control block 100 to the transfer bus connection block TG are provided at the right and left sides of the control block 100.

Figure 2:
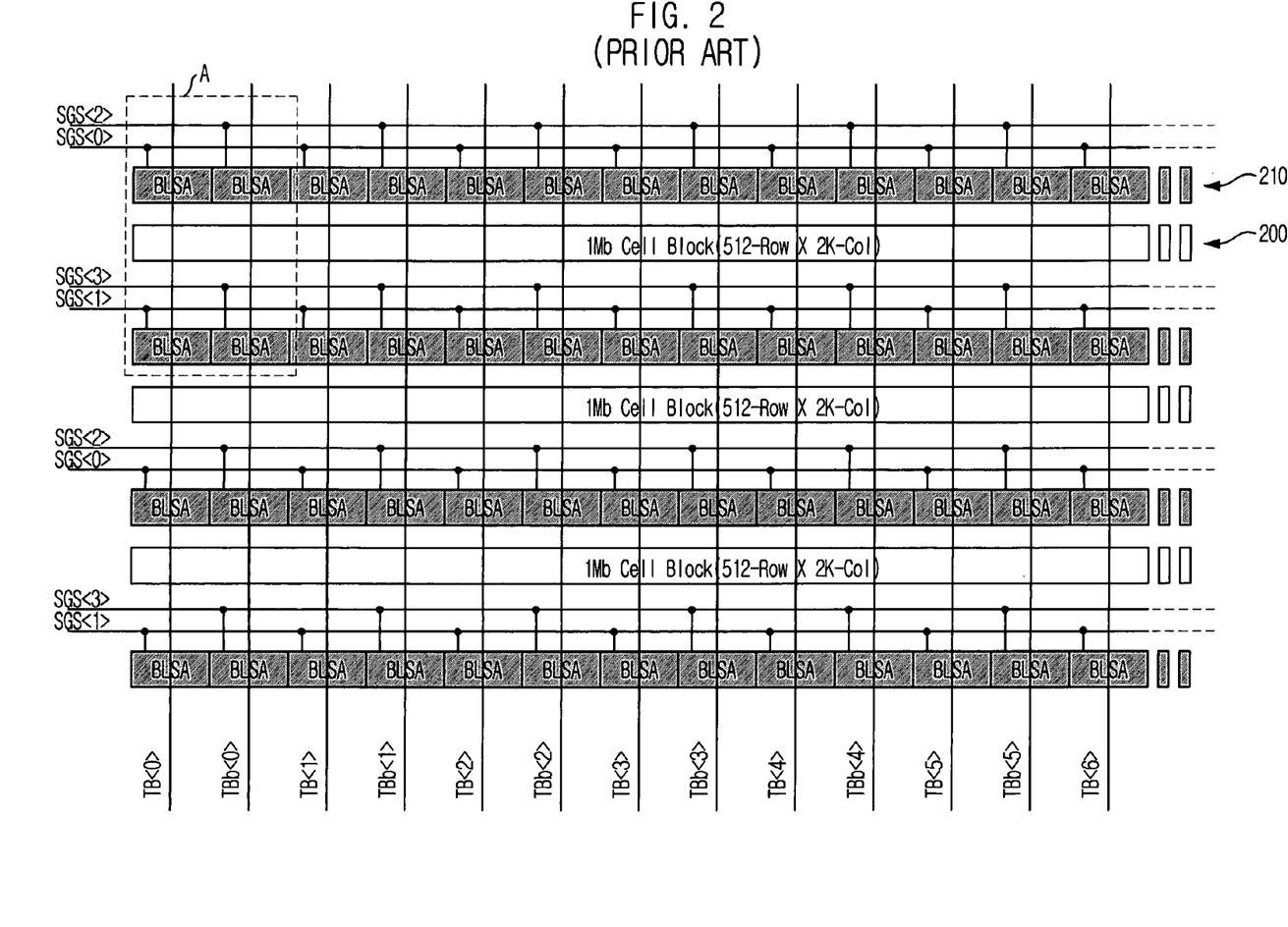
FIG. 2 is a block diagram illustrating a segment and a transfer bus TB in the 256M multi-port DRAM of FIG. 1.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quadrant can be connected through the transfer gates TG to the transfer buses TB corresponding to each bank of the third quadrant, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

Figure 3A:
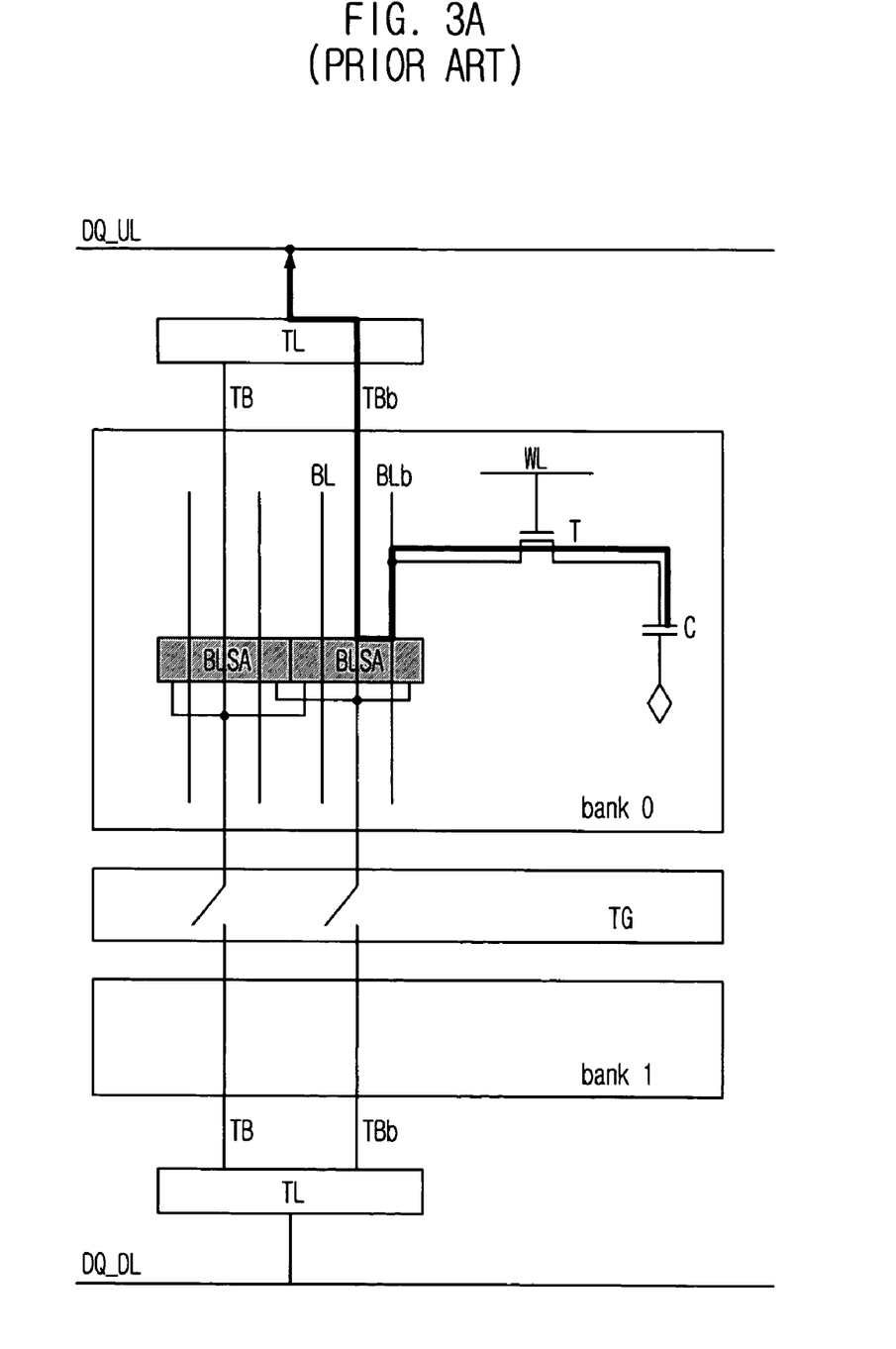
FIG. 3A illustrates a normal read path of the 256M multi-port DRAM depicted in FIG. 2.
Figure 3B:
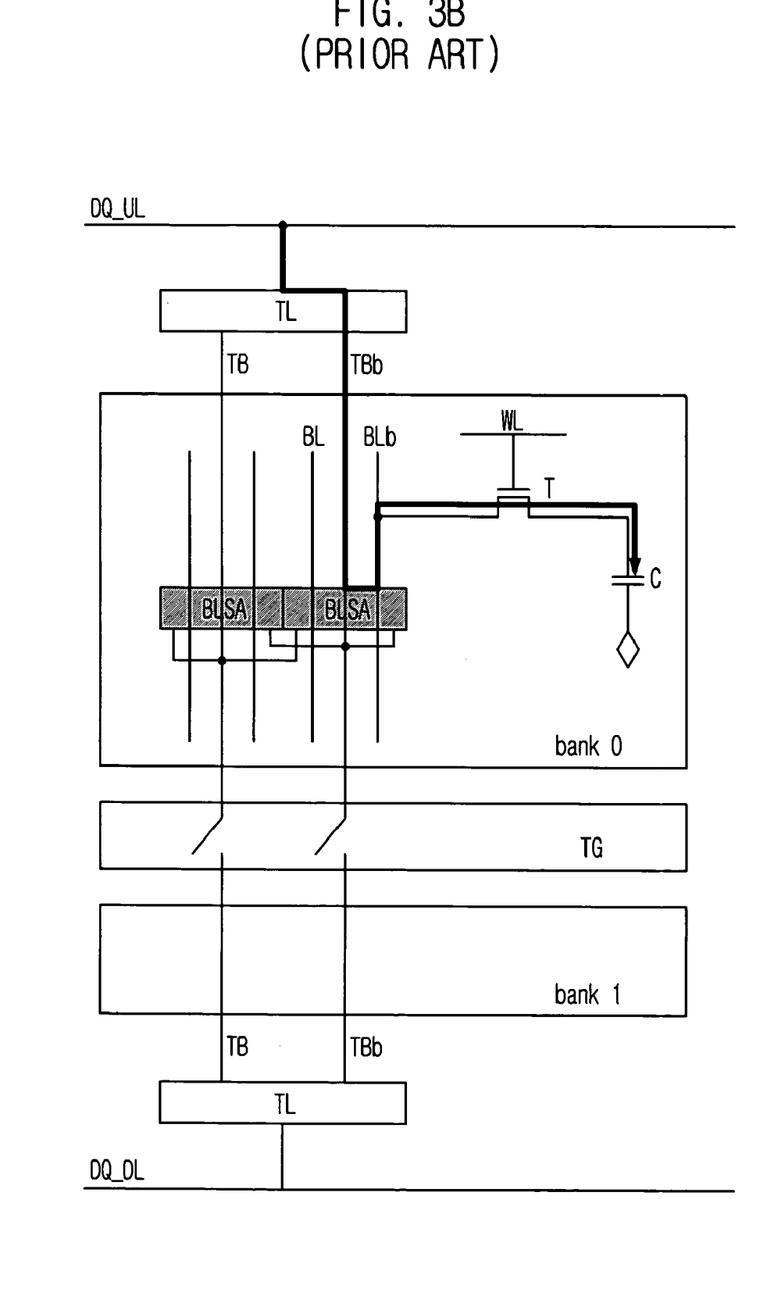
FIG. 3B illustrates a normal write path of the 256M multi-port DRAM depicted in FIG. 2.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (Rx) of the data transfer block TR corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell-capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (Tx) of the data transfer block TR and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

Figure 4A:
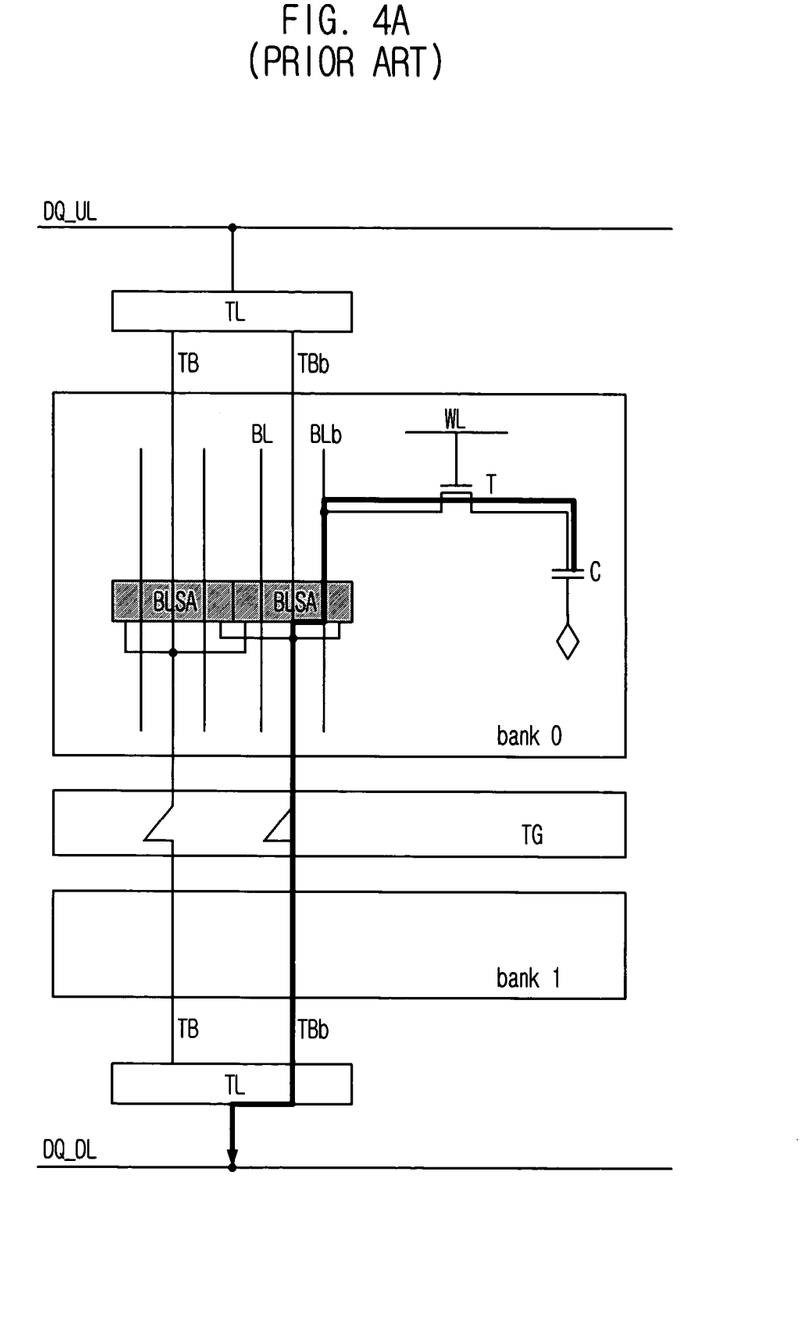
FIG. 4A illustrates a cross read path of the 256M multi-port DRAM depicted in FIG. 2.
Figure 4B:
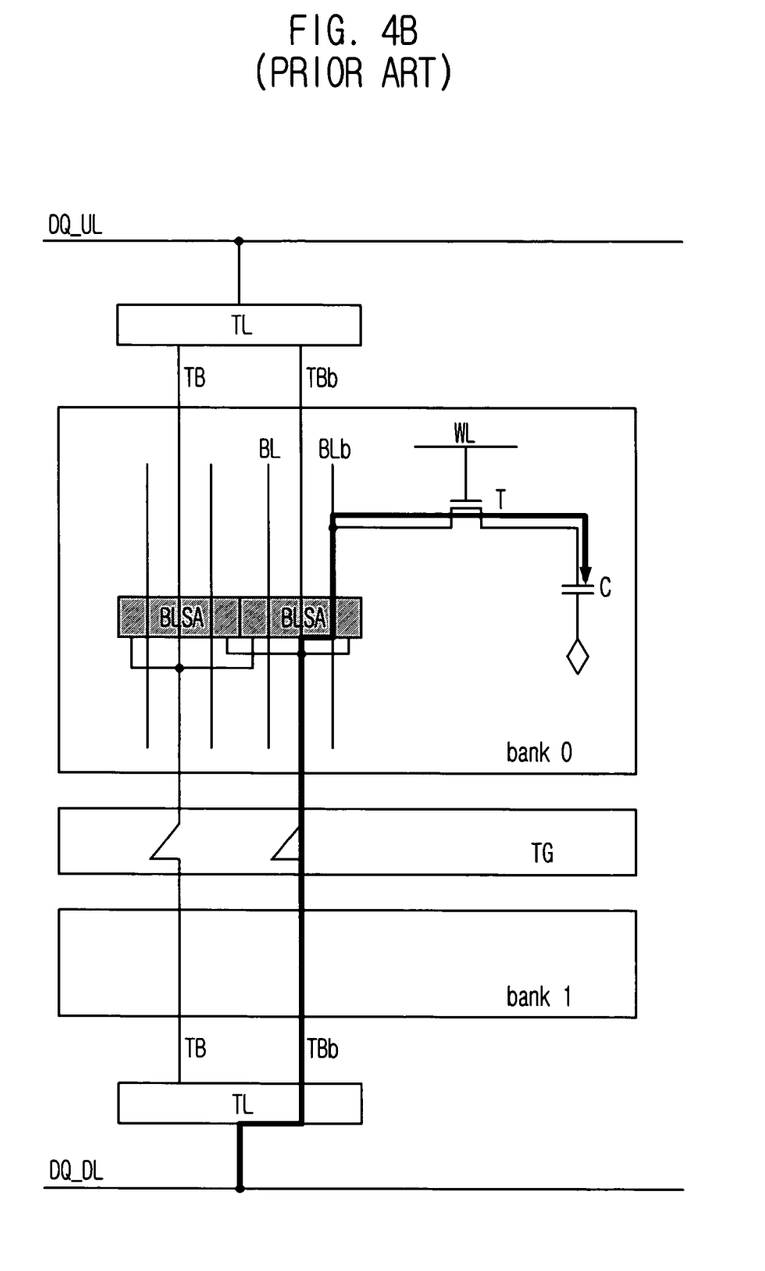
FIG. 4B illustrates a cross write path of the 256M multi-port DRAM depicted in FIG. 2.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block TR of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array.

In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quadrants of the core area through an application of the new architecture and can input/output data in serial at the ports. Accordingly, an increase of a layout area is minimized, a packaging is simplified, and a bandwidth is greatly increased without causing a skew between data lines at the data buses.

Meanwhile, the multi-port DRAM includes the global data bus having a wide width of 512M, and the first and second global data bus connection blocks PR_U and PR_D for connecting the divided global data buses to each other. Also, the first and second global data bus connection blocks PR_U and PR_D include bi-directional pipe registers corresponding to the number (512) of the lines of the global data buses.

Figure 5:
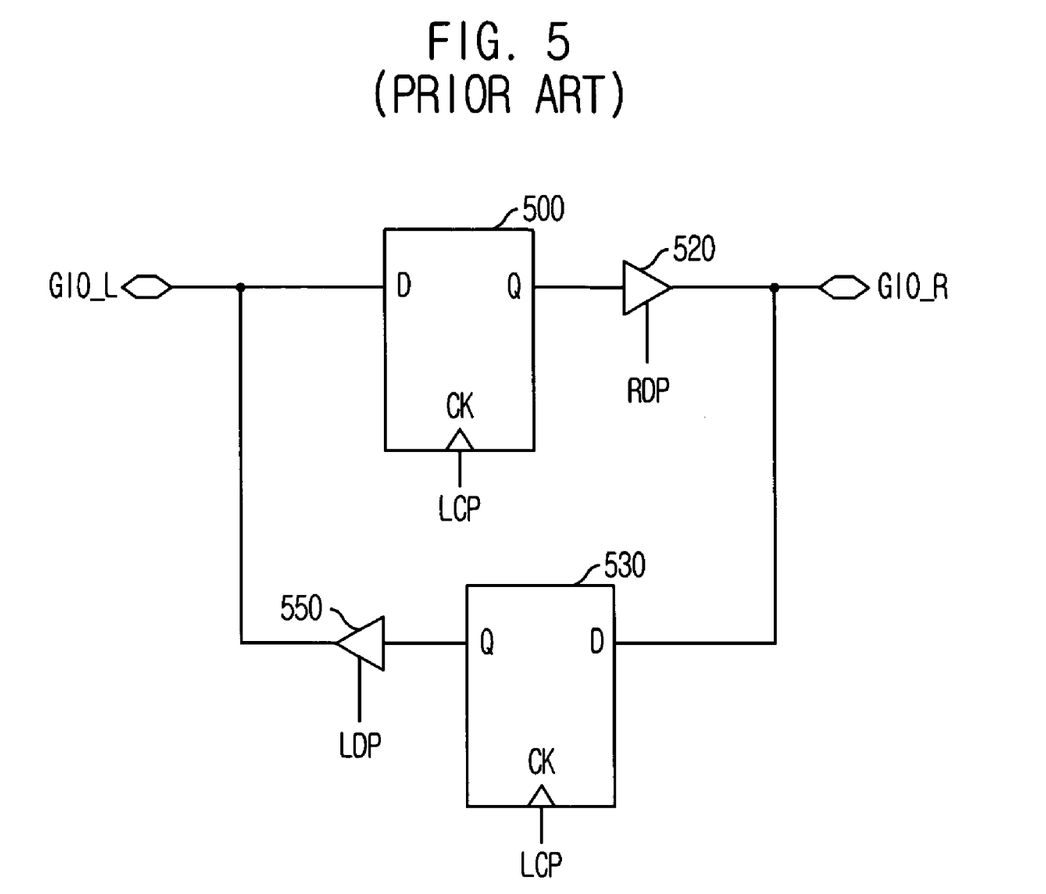
FIG. 5 is a circuit diagram of a unit bi-directional pipe register, which configures the first and second global data bus connection blocks of FIG. 1.

FIG. 5 is a circuit diagram of a unit bi-directional pipe register, which configures the first and second global data bus connection blocks PR_U and PR_D of FIG. 1.

Referring to FIG. 5, the bi-directional pipe register includes a flip-flop 500 for latching a signal of a left global data bus GIO_L in response to a left data capture pulse LCP, a driver 520 for driving an output signal of the flip-flop 500 to a right global data bus GIO_R in response to a right data driving pulse RDP, a flip-flop 530 for latching a signal of a right global data bus GIO_R in response to a right data capture pulse RCP, and a driver 550 for driving an output signal of the flip-flop 530 to a left global data bus GIO_L in response to a left data driving pulse LDP.

Here, the left data capture pulse LCP and the right data capture pulse RCP are signals for capturing data when data are received from the adjacent global data bus, and the left data driving pulse LDP and the right data driving pulse RDP are signals that are activated when data are transferred to the adjacent global data bus.

Figure 6:
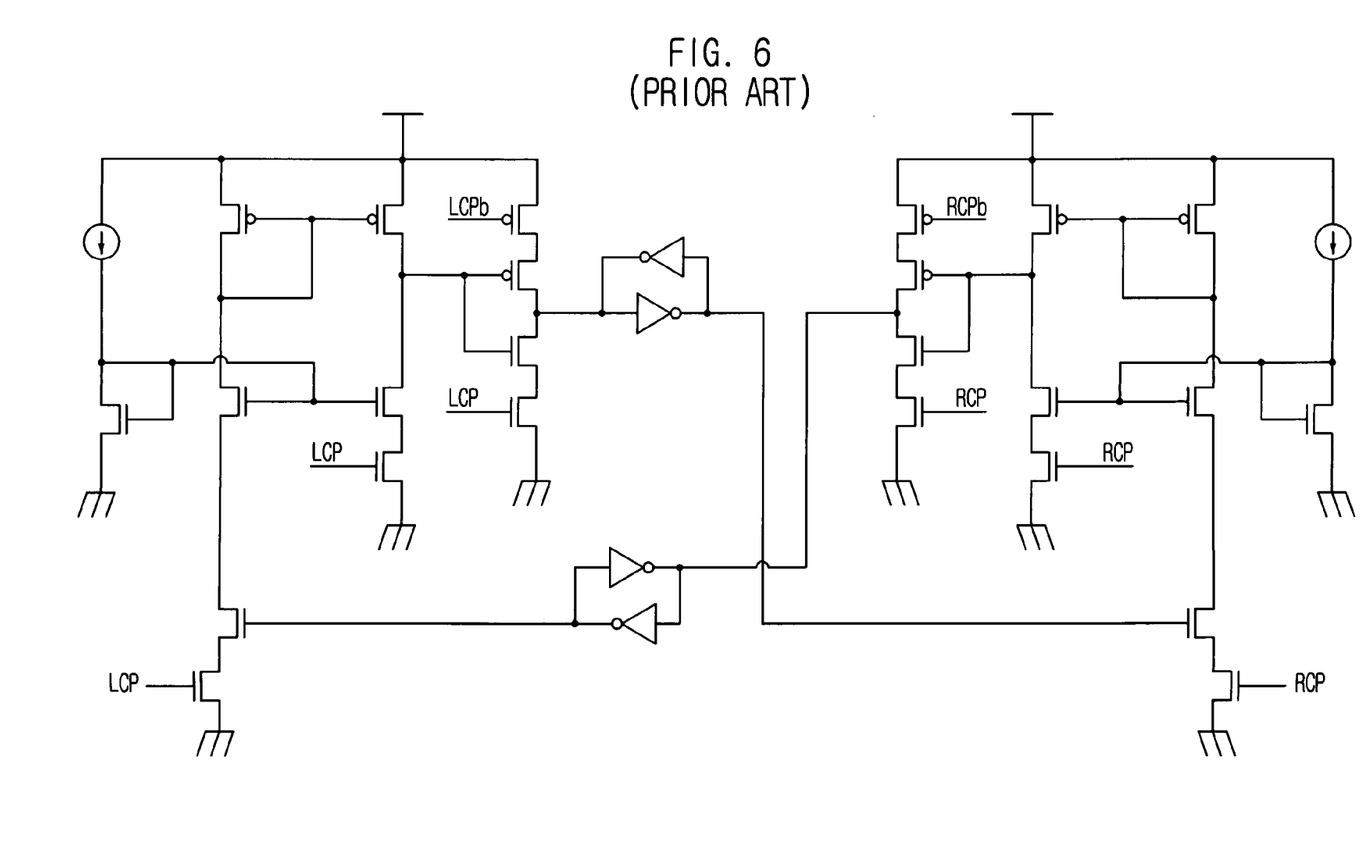
FIG. 6 is a detailed circuit diagram of the bi-directional pipe register shown in FIG. 5.

FIG. 6 is a detailed circuit diagram of the bi-directional pipe register shown in FIG. 5.

Referring to FIG. 6, an implementation of the bi-directional pipe register needs a lot of transistors. As described above, when the 512-bit global data buses are implemented, the required number of the circuit shown in FIG. 6 is 512.

Meanwhile, if considering that such unit bi-directional pipe registers are connected between the adjacent global data buses lines, the bi-directional pipe registers must be arranged within the layout area of the global data buses.

However, since a layout pitch of the unit bi-directional pipe register is greater than that of the global data bus, its arrangement is impossible in a general manner or a layout area is increased very much.

Figure 7:
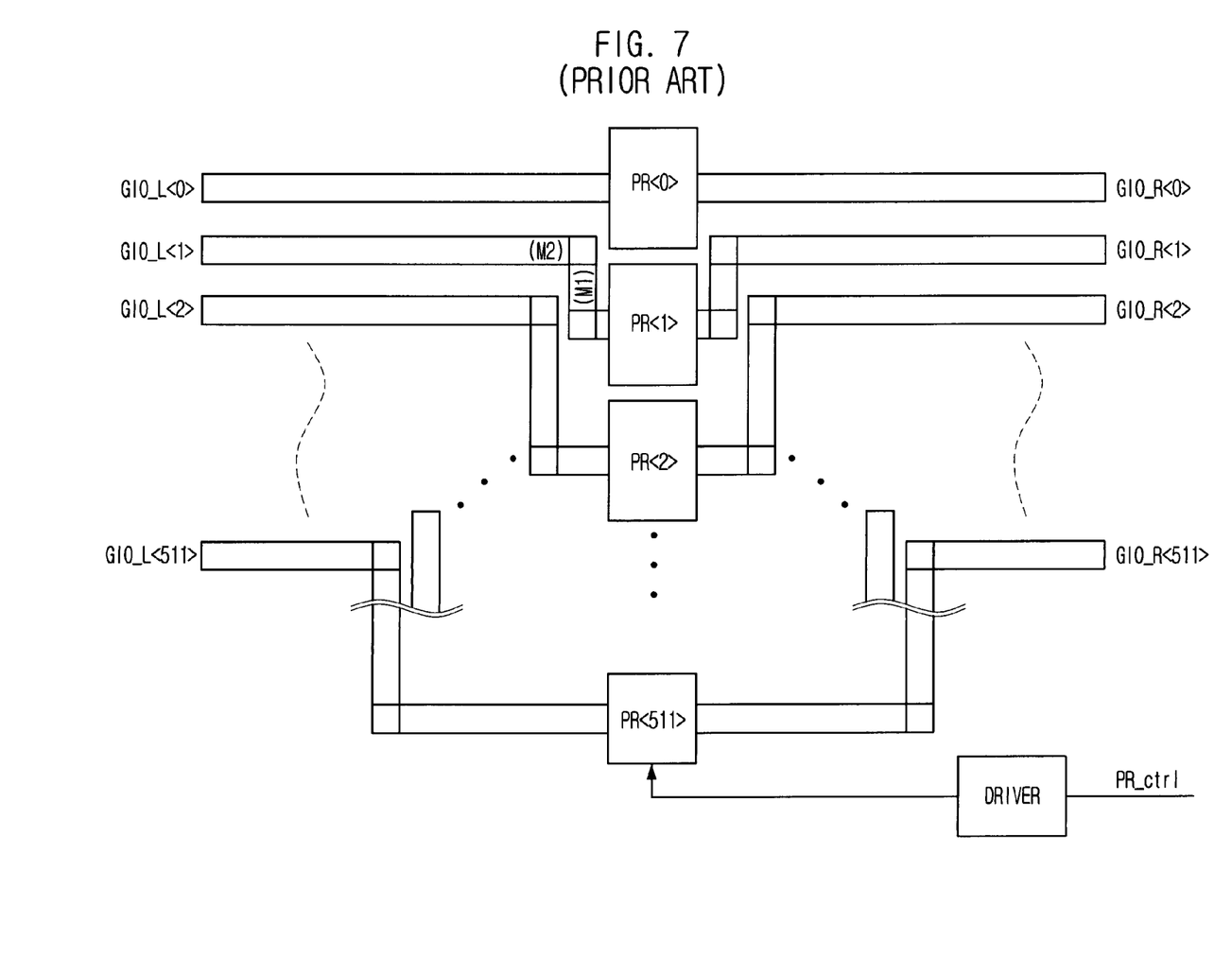
FIG. 7 is a layout illustrating an arrangement of the global data buses and the global data bus connection circuits, in which one-row arrangement method according to the prior art is applied.

FIG. 7 is a layout illustrating an arrangement of the global data buses and the global data bus connection circuits, in which one-row arrangement method according to the prior art is applied.

Referring to FIG. 7, 512 pipe registers PR<0:511> are arranged in one row and in a direction perpendicular to the global data buses.

In this case, if the overall layout of the global data buses intends to be maintained as it is, vertical interconnections M1 as well as horizontal interconnections M2 are required in order to escape other pipe registers and route pipes registers of the corresponding buses lines, because a pitch of the unit pipe register is greater than that of the global data bus. At this time, lengths of the vertical interconnections M2 become longer in a downward direction, thus increasing an overall layout area of the global data bus connection circuit.

Figure 8:
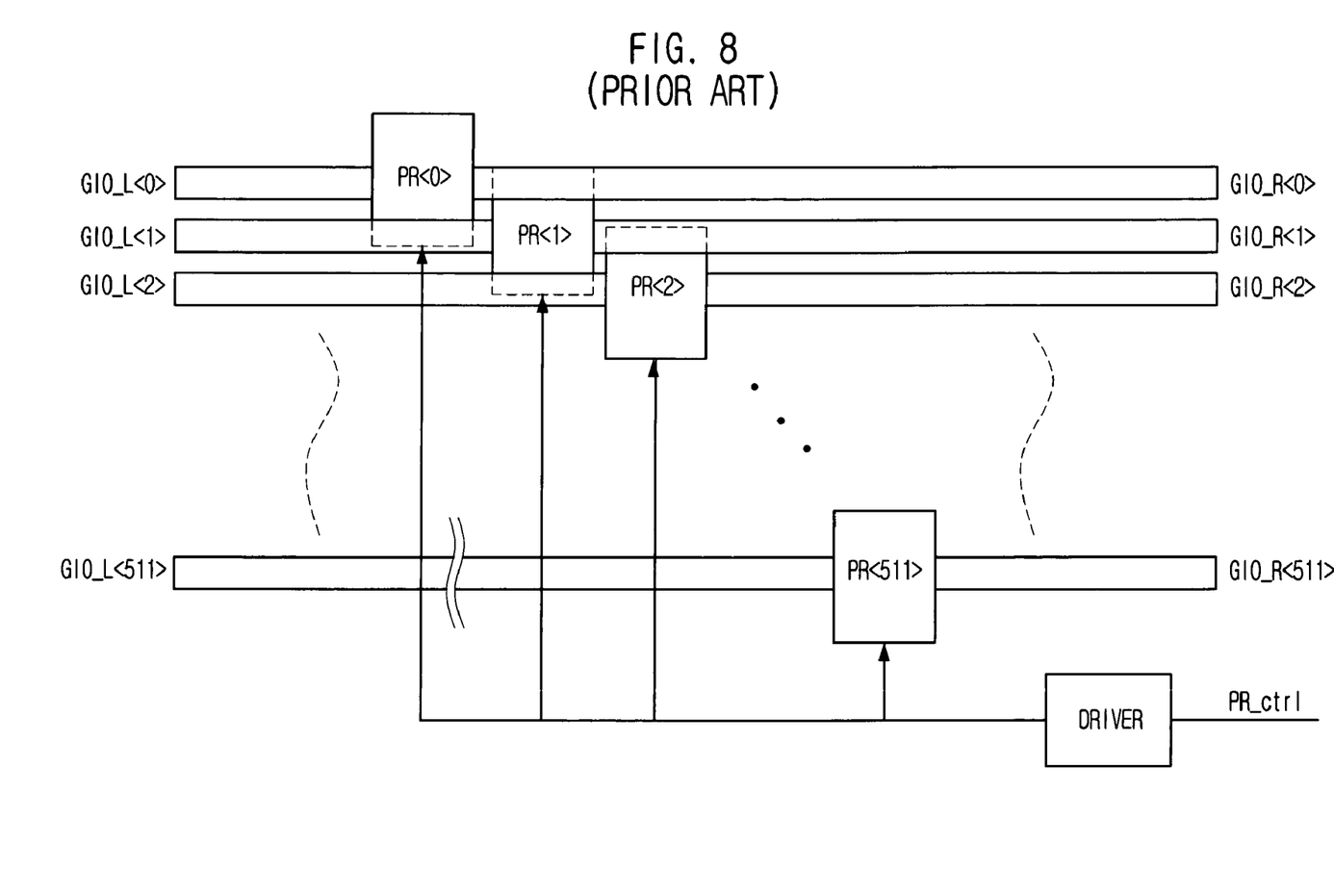
FIG. 8 is a layout illustrating an arrangement of the global data buses and the global data bus connection circuits, in which an oblique arrangement method according to the prior art is applied.

FIG. 8 is a layout illustrating an arrangement of the global data buses and the global data bus connection circuits, in which an oblique arrangement method according to the prior art is applied.

Referring to FIG. 8, 512 pipe registers PR<0:511> are arranged on different column axes. One pipe register is obliquely arranged to overlap with an adjacent global data bus line as well as its corresponding line axis.

In this case, the line arrangement of the global data buses can be maintained as it is. However, the global data bus connection circuits are extended in a horizontal direction compared with the one-row arrangement, thus increasing their overall layout area very much.

In case such arrangement methods according to the prior art are used, the line length of the global data bus is increased or a layout area of the global data bus connection circuit is increased. Further, according to the prior art, a pipe register control signal PR_ctrl is applied for the pipe registers PR<0:511> using one driver. In this case, loads to be driven by the pipe register control signal PR_ctrl are increased in proportion to the number of the lines of the global data buses, such that skew of the pipe register control signal PR_ctrl is increased.

SUMMARY OF THE INVENTION

It is, therefore, an object of the present invention to provide a multi-port memory device, which is capable of minimizing a layout area of a global data bus connection circuit while maintaining a line arrangement of global data buses.

It is another object of the present invention to provide a multi-port memory device, which is capable of reducing loads to be driven by a control signal of a global data bus connection circuit and minimizing skew of the pipe register control signal.

In an aspect of the present invention, there is provided a multi-port memory device comprising a plurality of unit global data bus connection circuits for selectively connecting first and second global data buses, each of which includes a plurality of lines, wherein the plurality of unit global data bus connection circuits are arranged in M×N matrix (M and N are integers greater than or equal to two), the respective unit global data bus connection circuits being overlapped with line axis of the corresponding first and second global data buses and adjacent line axis.

In another aspect of the present invention, there is provided a multi-port memory device comprising: a plurality of unit global data bus connection circuits for selectively connecting first and second global data buses, each of which includes a plurality of lines, wherein the plurality of unit global data bus connection circuits are arranged in M×N matrix (M and N are integers greater than or equal to two), the respective unit global data bus connection circuits being overlapped with line axis of the corresponding first and second global data buses and adjacent line axis; and N number of drivers for driving a plurality of unit global data bus connection circuits respectively arranged at N column axes.

In accordance with the present invention, the plurality of unit global data bus connection circuits for connecting adjacent global data buses are arranged in matrix. In this case, a layout area of the global data bus connection circuit can be minimized without modifying a line arrangement of the global data buses. Meanwhile, the present invention employs a method of driving control signals at each column axis of the matrix, thus reducing the loads to be driven by the control signal of the global data bus connection circuit and minimizing skew of the pipe register control signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 9:
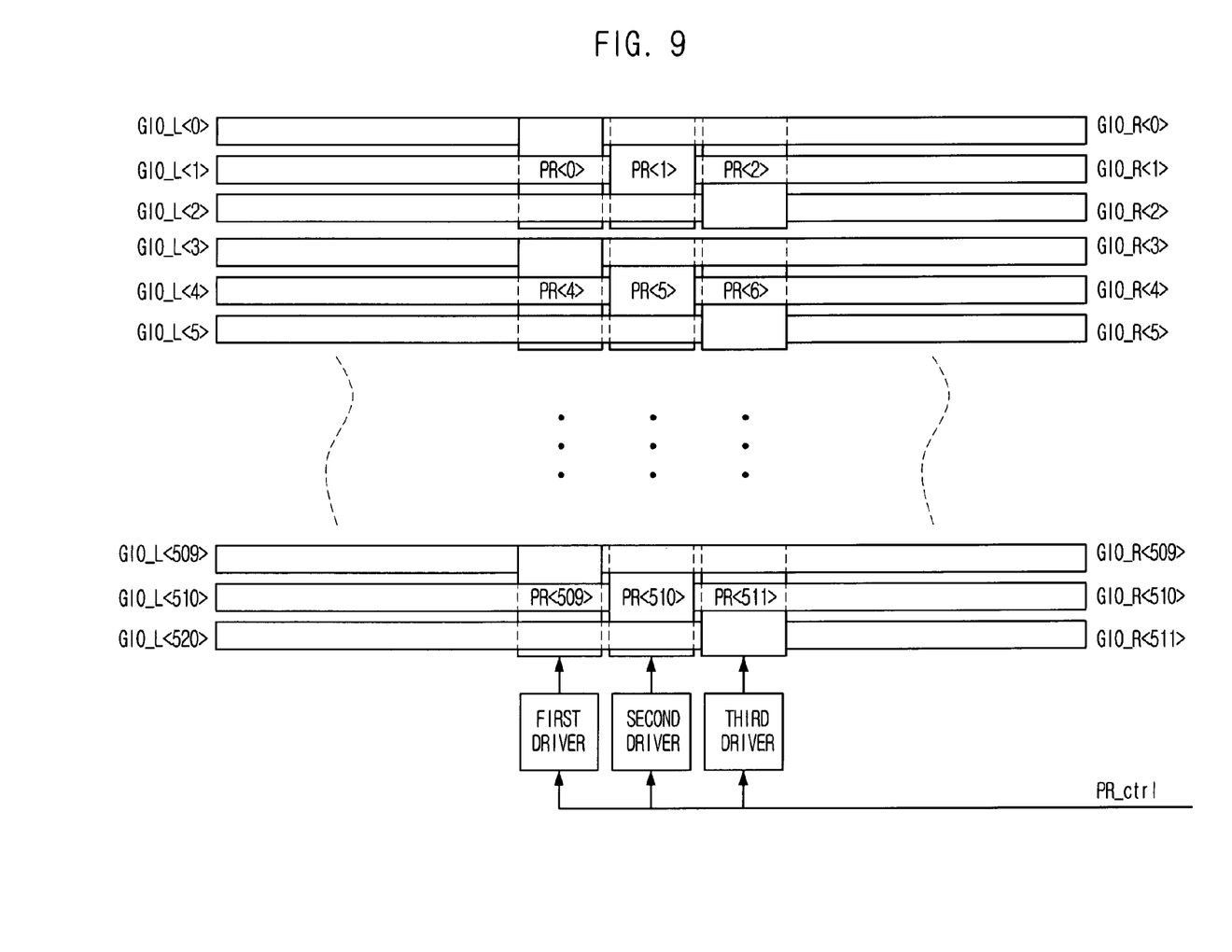
FIG. 9 is a layout illustrating an arrangement of global data buses and global data bus connection circuits in a multi-port memory device in accordance with an embodiment of the present invention.

FIG. 9 is a layout illustrating an arrangement of global data buses and global data bus connection circuits in a multi-port memory device in accordance with an embodiment of the present invention.

Referring to FIG. 9, 512-bit left global data buses GIO_L<0:511> and 512-bit right global data buses GIO_R<0:511> are arranged on the same axis. Each line of the global data buses is arranged at a predetermined interval. In other words, a line routing of the global data buses is not modified.

Meanwhile, three pipe registers PR<0:2> are orderly arranged overlapping on row axes formed by the three left global data bus lines GIO_L<0:2> and the three right global data bus lines GIO_R<0:2>.

Of course, the pipe register PR<0> is connected only to the left global data bus line GIO_L<0> and the right global data bus line GIO_R<0>, the pipe register PR<1> is connected only to the left global data bus line GIO_L<1> and the right global data bus line GIO_R<1>, and the pipe register PR<2> is connected only to the left global data bus line GIO_L<2> and the right global data bus line GIO_R<2>.

In this manner, the 512 pipe registers PR<0:511> are arranged in M×N matrix. Here, M and N are positive integers greater than or equal to two. However, because the number of bus lines in the memory device is determined like $2^k$ (k is a positive integer greater than or equal to two), it is preferable that M and N are 2×j (j is a positive integer).

Although this embodiment shows a method of arranging three columns as one example, the number (N) of the columns is determined by a line pitch of the global data bus. In other words, the number (N) of the columns is determined by the number of the global data bus lines, which can be contained within a column-direction length of one pipe register.

Although this embodiment exemplarily shows a case when three columns are applied for the convenience of explanation, this case cannot implement a perfect matrix. In other words, a portion which is not filled in the matrix is present. Of course, this case does not cause any problem.

As described above, according to the prior art, all pipe registers are controlled using one driver to drive a pipe register control signal PR_ctrl. However, according to the present invention, the drivers are provided at every column axis and only the pipe register of the corresponding column is controlled.

In this manner, loads to be driven by the control signal of the global data bus connection circuit are reduced to 1/N compared with the prior art. Further, skew of the pipe register control signal PR_ctrl can be minimized.

Although the case of the 521-bit global data buses is exemplarily shown in this embodiment, the present invention can be also applied to a case where the number of the global data buses is varied.

The present application contains subject matter related to Korean patent applications No. 2004-31931, filed in the Korean Patent Office on May 6, 2004, the entire contents of which being incorporated herein by reference While the present invention has been described with respect to the particular embodiments, it will be apparent to those skilled in the art that various changes and modifications may be made without departing from the spirit and scope of the invention as defined in the following claims.

What is claimed is:

1. A multi-port memory device comprising a plurality of unit global data bus connection circuits for selectively connecting first and second global data buses, each of which includes a plurality of lines, wherein the plurality of unit global data bus connection circuits are arranged in M×N matrix (M and N are integers greater than or equal to two), the respective unit global data bus connection circuits being overlapped with line axis of the corresponding first and second global data buses and adjacent line axis.

2. The multi-port memory device as recited in claim 1, wherein the number (N) of the columns is equal to the number of the lines of the first and second data buses, which are contained within a column-direction length of the unit global data bus connection circuit.

3. The multi-port memory device as recited in claim 1, wherein the number (N) of the columns is 2×j, where j is a positive integer.

4. The multi-port memory device as recited in claim 1, wherein the number (N) of the columns is 2×j, where j is a positive integer.

5. A multi-port memory device comprising:
   a plurality of unit global data bus connection circuits for selectively connecting first and second global data buses, each of which includes a plurality of lines, wherein the plurality of unit global data bus connection circuits are arranged in M×N matrix (M and N are integers greater than or equal to two), the respective unit global data bus connection circuits being overlapped with line axis of the corresponding first and second global data buses and adjacent line axis; and
   N number of drivers for driving a plurality of unit global data bus connection circuits respectively arranged at N column axes.

6. The multi-port memory device as recited in claim 5, wherein the number (N) of the columns is equal to the number of the lines of the first and second data buses, which are contained within a column-direction length of the unit global data bus connection circuit.

* * * * *